Jan. 6, 1970 H. S. CRAFTS 3,488,564

PLANAR EPITAXIAL RESISTORS

Filed April 1, 1968

INVENTOR.
HAROLD S. CRAFTS
BY Roger S. Borovoy
ATTORNEY

United States Patent Office 3,488,564
Patented Jan. 6, 1970

3,488,564

PLANAR EPITAXIAL RESISTORS

Harold S. Crafts, Palo Alto, Calif., assignor to Fairchild Camera and Instrument Corporation, Syosset, N.Y., a corporation of Delaware Filed Apr. 1, 1968, Ser. No. 717,757
Int. Cl. H01l *11/00, 7/00;* H03k *3/26*
U.S. Cl. 317—235 7 Claims

ABSTRACT OF THE DISCLOSURE

Two or more contact regions located along the upper surface of at least one isolation pocket of a semiconductor device provide separate contacts to a buried collector region within the pocket. One contact region provides a supply voltage electrode, while another contact region provides a separate output electrode for the collector region. The resistance of the supply voltage signal path compared to the output signal path may be varied by changing the respective contact areas, thus saving valuable surface area and increasing the potential complexity the device.

BACKGROUND OF THE INVENTION

Field of the invention

This invention relates to a structure for a semiconductor device with at least one isolation pocket therein containing a resistor and another circuit element, such as a bipolar transistor.

Description of the prior art

In semiconductor devices, such as integrated circuits having isolation pockets of semiconductor material, the resistors are usually formed either by deposition or diffusion in isolation pockets that are separate from pockets containing other circuit elements, or by placing a thin film of resistive material along the device upper surface. Although such resistor structures have proved satisfactory for many of the integrated circuits heretofore manufactured, the resistors are less desirable for large-scale integration. Using separate isolation pockets for the resistors or forming thin-film resistors along the upper surface requires an unnecessarily large amount of surface area. Because the potential complexity of an integrated semiconductor device is a function of the number of electrical components contained within the wafer, and the number of components that can be formed in a wafer is a function of the amount of wafer surface area available, it is desirable to form the resistors in such a manner that less surface area is needed for each resistor, thereby increasing the potential complexity of the device.

SUMMARY OF THE INVENTION

Briefly, the invented structure for a semiconductor device with at least one isolation pocket therein containing a resistor and another circuit element comprises a layer of semiconductor material of one conductivity type having an upper and a lower surface. A first region of the one conductivity type is located along a portion of the lower surface and has a substantially higher impurity concentration than the semiconductor layer. A second region of opposite conductivity type lies within the semiconductor layer and extends from the upper surface; this second region substantially overlies a portion of the first region but is separated therefrom. Formed between the layer and the second region is a first PN junction having an edge at the device upper surface. A third region of the one conductivity type extends from the upper surface and is located within the second region, forming a second PN junction therewith with an edge at the upper surface.

Disposed within the semiconductor layer along a portion of the upper surface but separated from the second region are fourth and fifth regions of the one conductivity type but having substantially higher impurity concentrations than the semiconductor layer. The fourth and fifth regions overlie portions of the first region but are separated therefrom and are separated from each other, preferably with the second region interposed laterally therebetween. Between the first region and the fourth region, or between the first region and the fifth region, the resistance of a signal path is a function of the area of the respective fourth or fifth region. Normally, the fourth and fifth regions comprise approximately the same impurity concentration and gradation and approximately the same depth. Hence, if the fifth region area is substantially smaller than the area of the fourth region, then the resistance of a signal path between the fifth region and the first region is substantially greater than that between the fourth region and the first region. If desired, a sixth region of the one conductivity type can extend from the upper surface within the second region but separated from the third region, the sixth region thus forming with the second region a third PN junction having an edge at the upper surface.

The invented structure is applicable to integrated arrays and to large-scale integration having a plurality of isolation pockets of semiconductor material, particularly where in at least one pocket there are one or more bipolar transistors and at least one region, such as a collector, is a buried layer. With this structure, the amount of valuable surface area needed is reduced, thereby enabling the semiconductor device to have higher complexity per unit area than heretofore possible.

DESCRIPTION OF THE PREFERRED EMBODIMENT

Figure 1:
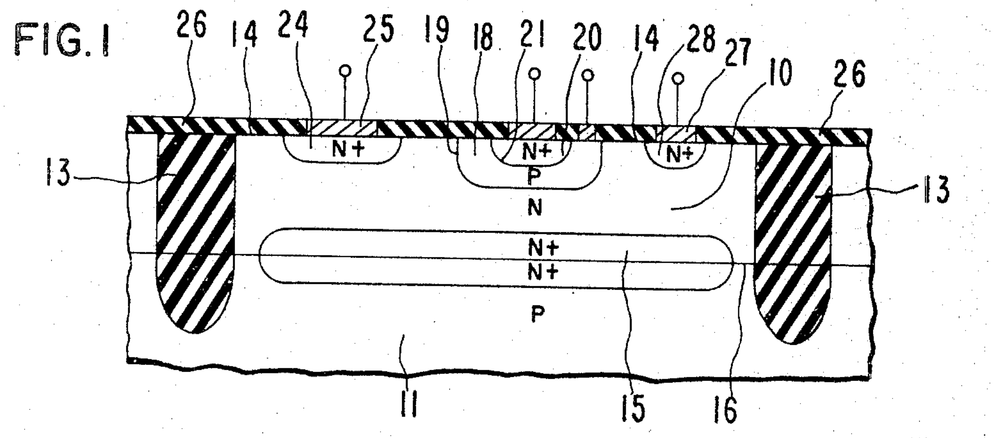
FIG. 1 is a simplified cross-sectional view of a preferred embodiment of the invention wherein a resistor is formed within the same isolation pocket as another circuit element.

Referring to FIG. 1, the invented structure comprises a layer 10 of semiconductor material supported by a substrate 11. The supporting substrate 11 comprises either a conducting or semiconducting material such as silicon, or an insulating material such as glass. For the purposes of explanation, the semiconductor, material of layer 10 is of a first conductivity type, indicated in FIG. 1 by the letter N. However, it is possible to interchange the conductivity type of the semiconductor material throughout the device without changing the concept of the invention (that is, replace n-type material with p-type, and vice versa). The semiconductor layer 10 suitably is formed upon the supporting substrate 11 by epitaxial deposition. Isolation of the semiconductor layer 10 from other parts of the device is provided by an isolation region 13, which essentially surrounds the semiconductor layer 10 and may be filled with insulation material to form an isolation pocket, electrically insulated from other active portions of the device. The isolation region 13 suitably is formed by mesa etching, by dielectric isolation in which a groove is etched and then filled with an insulating material such as silicon dioxide, or by diffusion in which a dopant of an opposite conductivity type compared to that of layer 10 is diffused from the upper surface 14 through layer 10. A first region 15 of the first conductivity type material but having a higher concentration of suitable dopants to increase its conductivity (indicated by N+) relative to layer 10 lies along a portion of the lower surface 16 of the semiconductor layer 10. For a bipolar transistor having a base, emitter, and collector, region 15 normally comprises the buried collector. Suitably, the buried collector region 15 is formed by diffusion prior to epitaxial deposition of layer 10. A second region 18 of an opposite conductivity type material, indicated in FIG. 1 by the latter P, is disposed within a portion of the semiconductor layer 10 and extends from the upper surface 14, forming a first PN junction 19, which has an edge at the upper surface 14. In a bipolar transistor, second region 18 normally comprises the base. Suitably, base region 18 is formed by any of the well-known semiconductor diffusion techniques.

Disposed within the second region 18 is a third region 20 of the first conductivity type. Region 20 extends from the upper surface 14, forming a second PN junction 21 which has an edge at surface 14. With a bipolar transistor, region 20 normally comprises the emitter. The emitter region 20 may also be formed by any of the well-known semi-conductor diffusion techniques. A fourth region 24 of the first conductivity, but having a higher concentration of suitable dopants to increase its conductivity relative to layer 10 is disposed along a portion of the upper surface 14 of layer 10 separated from the base region 18. In a prior-art bipolar transistor, the fourth region 24 normally would provide a means for applying supply voltage to the buried collector 15, and for making contact to an external load resistor (not shown). The load resistor is usually formed in a separate pocket (not shown) or along the upper surface 14 or upon the overlying protective layer 26, thereby using valuable surface area and reducing the potential number of electrical components that can be fabricated within the device. To eliminate this drawback, a second contact region 28 is disposed within the isolation pocket itself along the upper surface 14 thereof but separated from the base region 18, and overlies a portion of the buried collector region 15. Contact region 28 is of the first conductivity type and has a higher concentration of suitable dopants to ensure ohmic contact to layer 10. Preferably, base region 18 interposed between contact regions 24 and 28. Thus, contact region 28 provides a second means for applying signals to or receiving signals from the buried collector 15. Using this structure, one may conveniently apply a supply voltage to contact region 24 via electrode 25, and obtain an output signal from contact region 28 via electrode 27.

It should be noted that the resistance of the signal paths between collector region 15 and respective contact regions 24 and 28 depend upon a number of factors, including among others the area of the regions and their depth, impurity concentration, and gradation. If the latter three factors are substantially the same for contact regions 24 and 28, then the resistance of the respective signal paths is approximately a function of respective contact areas 24 and 28. For many applications it is desirable that the resistance of the signal path for the supply voltage be substantially different from that for the output signal. If the area of contact region 28 is substantially smaller than the area of contact region 24, then the resistance of a signal path between region 28 and region 15 is substantially greater than that between region 24 and region 15. Because contact region 28 has a comparatively small area (compared to that of contact region 24), a relatively large internal resistance is thereby created for the output signal (compared to that of the supply voltage signal) in the same isolation pocket as the transistor. Suitably, contact regions 24 and 28 may be formed by diffusion, either in separate steps, in the same step, or in the same step as the emitter region 20. Alternatively, ion implantation techniques may be used to form contact regions 24 and 28, thereby eliminating the need to reheat the structure, which is usually required for the above-mentioned diffusion approach.

The invention will be further appreciated from the fact that it is possible to form a circuit element, such as a bipolar transistor, and a load resistor within the same isolation pocket, thereby substantially reducing the area required for such a combination of components. Hence, many more circuit components or elements can be fabricated in a higher density array than heretofore possible.

Figure 2:
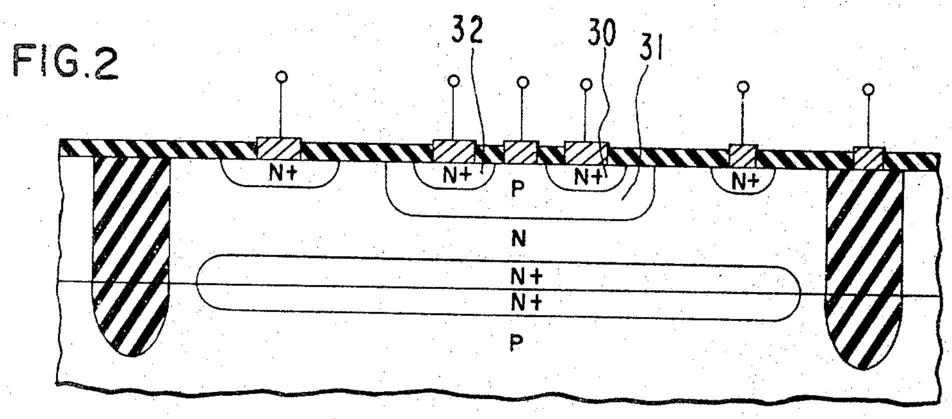
FIG. 2 is a simplified cross-sectional view of an alternative embodiment of the invention wherein a second emitter region formed in the isolation pocket provides a dual emitter element.

Referring to FIG. 2, an alternative embodiment of the invention is illustrated. Here, a second emitter region 30 is disposed within the base region 31 along side the first emitter region 32 but separated therefrom, thus forming a dual-emitter bipolar transistor having a load resistor within the same isolation pocket. Other possible combinations and arrangements incorporating the invented technique will be readily apparent to one skilled in the art.

Figure 3:
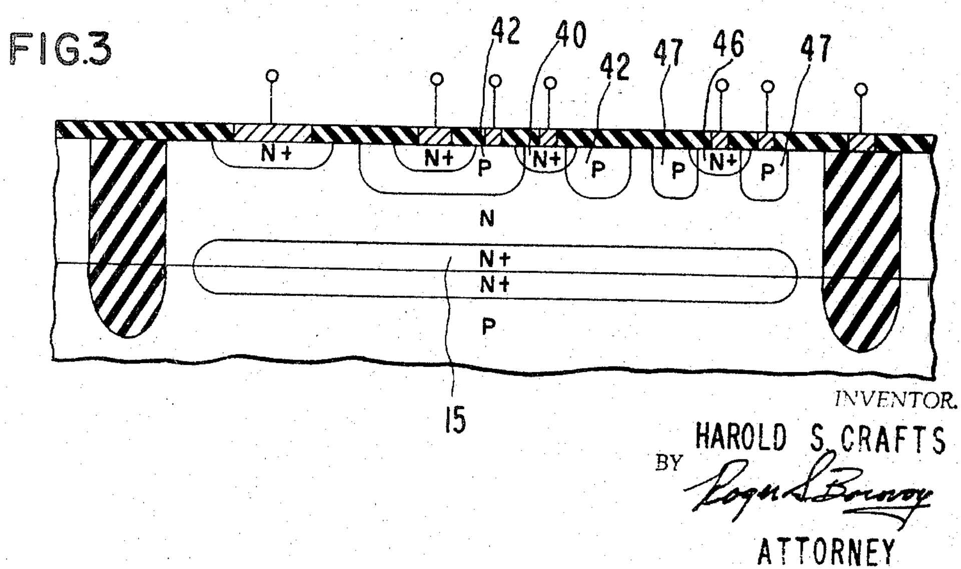
FIG. 3 is a simplified cross-sectional view of another alternative embodiment of the invention wherein a plurality of contact regions are formed extending from the device upper surface.

Referring to FIG. 3, another alternative embodiment of the invention is illustrated. The second contact 40 is formed so that a portion of the base region 42 overlaps a portion of the second contact region 40, thereby reducing the effective area of contact 40 and increasing the resistance of a signal path between the buried collector 15 and contact 40. In other words, overlapping region 42 pinches off some of the area of the contact 40, and thereby increases the signal path resistance to the buried collector 15. Still another contact region 46 of the one conductivity type may be overlapped by a region 47 of opposite conductivity type, which pinches off a portion of the effective area of contact 46 and increases the signal path resistance to the buried collector 15. In either or both of these ways, or a combination of them, a plurality of such contact regions can be formed along the pocket upper surface for making contact to the buried collection region, and the resistance of each signal path therebetween is effectively controlled by using the overlapping region of opposite conductivity to "pinch off" a portion of the effective contact area.

Using the invented technique, it is possible to fabricate a semiconductor device on a wafer 50 mils by 50 mils containing up to 200 transistors and 200 resistors. In comparison, a prior-art semiconductor device of the same size usually contains less than 50 transistors and 50 resistors. Accordingly, with the invented technique, the potential complexity of a semiconductor device is increased by a factor of up to four, and the price per circuit element reduced by a factor of four.

I claim:

1. A structure for a semiconductor device having at least one isolation pocket containing at least one circuit element, the structure comprising:

a layer of semiconductor material of one conductivity type having an upper and lower surface;

a first region of opposite conductivity type disposed within said layer, said first region forming with said first layer a first PN junction having an edge at said upper surface;

a second region of said one conductivity type disposed within said first region and forming a second PN junction therewith, said second junction having an edge at said upper surface;

a high-conductance region of said one conductivity type located within and extending along a portion of the lower surface of said layer, the impurity concentration of said region being substantially greater than that of said layer;

a plurality of separate contact regions of said one conductivity type located within said layer and extending from said upper surface and overlying but separated from said high-conductance region, the impurity concentration of said contact regions being substantially greater than that of said layer, at least one contact region having an effective contact area that is substantially different from that of the other contact regions, thereby providing a plurality of signal paths within said layer between said contact regions and said high-conductance region wherein the resistance value of at least one signal path is substantially different from that of the other signal paths.

2. The structure recited in claim 1 wherein said first region is located laterally between at least two of said contact regions.

3. The structure recited in claim 1 including a third region of said one conductivity type located within said first region and separated from said second region, said third region forming with said first region a third PN junction having an edge at said upper surface.

4. The structure recited in claim 1 further defined by a portion of said first region extending to overlap a portion of at least one contact region, thereby reducing the effective contact area thereof and substantially increasing the resistance of a signal path between said high conductance region and the overlapped contact region.

5. The structure recited in claim 1 further defined by a region of opposite conductivity type separate from said first region and located along and extending from said upper surface to overlap a portion of at least one contact region, thereby reducing the effective contact area thereof and substantially increasing the resistance of a signal path between said high-conductance region and the overlapped contact region.

6. The structure recited in claim 1 further defined by a plurality of regions of opposite conductivity type separate from said first region and located along and extending from said upper surface to overlap portions of at least one of said contact regions, thereby reducing the effective area thereof and substantially increasing the resistance of a signal path between said overlapped contact region and said high-conductance region.

7. The structure recited in claim 1 further defined by a means for coupling a supply voltage to at least one contact of said plurality, and a means for coupling an output to at least another contact of said plurality.

References Cited

UNITED STATES PATENTS

| | | | |
|---|---|---|---|
| 3,211,972 | 10/1965 | Kilby et al. | 317—235 |
| 3,325,705 | 6/1967 | Clark | 317—235 |
| 3,363,152 | 1/1968 | Lin | 317—235 |

JERRY D. CRAIG, Primary Examiner

U.S. Cl. X.R.

307—303